(12) United States Patent
Liu et al.

(10) Patent No.: US 7,910,397 B2
(45) Date of Patent: Mar. 22, 2011

(54) SMALL ELECTRODE FOR RESISTANCE VARIABLE DEVICES

(75) Inventors: Jun Liu, Boise, ID (US); Terry L. Gilton, Boise, ID (US); John T. Moore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1164 days.

(21) Appl. No.: 11/598,089

(22) Filed: Nov. 13, 2006

(65) Prior Publication Data

US 2007/0166983 A1    Jul. 19, 2007

Related U.S. Application Data

(62) Division of application No. 11/018,366, filed on Dec. 22, 2004, now Pat. No. 7,374,174.

(51) Int. Cl.
*H01L 21/00* (2006.01)
(52) U.S. Cl. ........... 438/95; 257/E31.029; 265/163; 265/165
(58) Field of Classification Search ............ 438/48, 438/57, 93, 95, 597; 257/2–5, E31.029; 365/165, 365/163
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,599,705 A | 7/1986 | Holmberg et al. |
| 4,608,296 A | 8/1986 | Keem et al. |

(Continued)

FOREIGN PATENT DOCUMENTS

JP    5-6126916    10/1981

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

(Continued)

*Primary Examiner* — Brook Kebede
(74) *Attorney, Agent, or Firm* — Dickstein Shapiro LLP

(57) ABSTRACT

A memory element comprising first and second electrodes is provided. The first electrode is tapered such that a first end of the first electrode is larger than a second end of the first electrode. A resistance variable material layer is located between the first and second electrodes, and the second end of the first electrode is in contact with the resistance variable material. Methods for forming the memory element are also provided.

26 Claims, 8 Drawing Sheets

U.S. PATENT DOCUMENTS

| | | | |
|---|---|---|---|
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,671,618 A | 6/1987 | Wu et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | |
| 4,800,526 A | 1/1989 | Lewis | |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Sliwa et al. | |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | |
| 5,219,788 A | 6/1993 | Abernathey et al. | |
| 5,238,862 A | 8/1993 | Blalock et al. | |
| 5,272,359 A | 12/1993 | Nagasubramanian et al. | |
| 5,296,716 A | 3/1994 | Ovshinsky et al. | |
| 5,314,772 A | 5/1994 | Kozicki | |
| 5,315,131 A | 5/1994 | Kishimoto et al. | |
| 5,335,219 A | 8/1994 | Ovshinsky et al. | |
| 5,341,328 A | 8/1994 | Ovshinsky et al. | |
| 5,350,484 A | 9/1994 | Gardner et al. | |
| 5,359,205 A | 10/1994 | Ovshinsky | |
| 5,360,981 A | 11/1994 | Owen et al. | |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | |
| 5,512,773 A | 4/1996 | Wolf et al. | |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A * | 11/1997 | Ovshinsky | 365/163 |
| 5,694,054 A | 12/1997 | Ovshinsky et al. | |
| 5,714,768 A | 2/1998 | Ovshinsky et al. | |
| 5,726,083 A | 3/1998 | Takaishi | |
| 5,751,012 A | 5/1998 | Wolstenholme et al. | |
| 5,761,115 A | 6/1998 | Kozicki et al. | |
| 5,789,277 A | 8/1998 | Zahorik et al. | |
| 5,814,527 A | 9/1998 | Wolstenholme et al. | |
| 5,818,749 A | 10/1998 | Harshfield | |
| 5,825,046 A | 10/1998 | Czubatyj et al. | |
| 5,841,150 A | 11/1998 | Gonzalez et al. | |
| 5,846,889 A | 12/1998 | Harbison et al. | |
| 5,851,882 A | 12/1998 | Harshfield | |
| 5,869,843 A | 2/1999 | Harshfield | |
| 5,896,312 A | 4/1999 | Kozicki et al. | |
| 5,912,839 A | 6/1999 | Ovshinsky et al. | |
| 5,914,893 A | 6/1999 | Kozicki et al. | |
| 5,920,788 A | 7/1999 | Reinberg | |
| 5,933,365 A | 8/1999 | Klersy et al. | |
| 5,998,066 A | 12/1999 | Block et al. | |
| 6,011,757 A | 1/2000 | Ovshinsky | |
| 6,031,287 A | 2/2000 | Harshfield | |
| 6,072,716 A | 6/2000 | Jacobson et al. | |
| 6,077,729 A | 6/2000 | Harshfield | |
| 6,084,796 A | 7/2000 | Kozicki et al. | |
| 6,087,674 A | 7/2000 | Ovshinsky et al. | |
| 6,117,720 A | 9/2000 | Harshfield | |
| 6,141,241 A | 10/2000 | Ovshinsky et al. | |
| 6,143,604 A | 11/2000 | Chiang et al. | |
| 6,177,338 B1 | 1/2001 | Liaw et al. | |
| 6,236,059 B1 | 5/2001 | Wolsteinholme et al. | |
| RE37,259 E | 7/2001 | Ovshinsky | |
| 6,297,170 B1 | 10/2001 | Gabriel et al. | |
| 6,300,684 B1 | 10/2001 | Gonzalez et al. | |
| 6,316,784 B1 | 11/2001 | Zahorik et al. | |
| 6,329,606 B1 | 12/2001 | Freyman et al. | |
| 6,339,544 B1 | 1/2002 | Chiang et al. | |
| 6,348,365 B1 | 2/2002 | Moore et al. | |
| 6,350,679 B1 | 2/2002 | McDaniel et al. | |
| 6,376,284 B1 | 4/2002 | Gonzalez et al. | |
| 6,388,324 B2 | 5/2002 | Kozicki | |
| 6,391,688 B1 | 5/2002 | Gonzalez et al. | |
| 6,404,665 B1 | 6/2002 | Lowery et al. | |
| 6,414,376 B1 | 7/2002 | Thakur et al. | |
| 6,418,049 B1 | 7/2002 | Kozicki et al. | |
| 6,420,725 B1 | 7/2002 | Harshfield | |
| 6,423,628 B1 | 7/2002 | Li et al. | |
| 6,429,064 B1 | 8/2002 | Wicker | |
| 6,437,383 B1 | 8/2002 | Xu | |
| 6,440,837 B1 | 8/2002 | Harshfield | |
| 6,462,984 B1 | 10/2002 | Xu et al. | |
| 6,469,364 B1 | 10/2002 | Kozicki | |
| 6,473,332 B1 | 10/2002 | Ignatiev et al. | |
| 6,480,438 B1 | 11/2002 | Park | |
| 6,487,106 B1 | 11/2002 | Kozicki | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B2 | 1/2003 | Hudgens et al. | |
| 6,511,867 B2 | 1/2003 | Lowery et al. | |
| 6,512,241 B1 | 1/2003 | Lai | |
| 6,514,805 B2 | 2/2003 | Xu et al. | |
| 6,531,373 B2 | 3/2003 | Gill et al. | |
| 6,534,781 B2 | 3/2003 | Dennison | |
| 6,545,287 B2 | 4/2003 | Chiang | |
| 6,545,907 B1 | 4/2003 | Lowery et al. | |
| 6,555,860 B2 | 4/2003 | Lowery et al. | |
| 6,563,164 B2 | 5/2003 | Lowery et al. | |
| 6,566,700 B2 | 5/2003 | Xu | |
| 6,567,293 B1 | 5/2003 | Lowery et al. | |
| 6,569,705 B2 | 5/2003 | Chiang et al. | |
| 6,570,784 B2 | 5/2003 | Lowery | |
| 6,576,921 B2 | 6/2003 | Lowery | |
| 6,586,761 B2 | 7/2003 | Lowery | |
| 6,589,714 B2 | 7/2003 | Maimon et al. | |
| 6,590,807 B2 | 7/2003 | Lowery | |
| 6,593,176 B2 | 7/2003 | Dennison | |
| 6,597,009 B2 | 7/2003 | Wicker | |
| 6,605,527 B2 | 8/2003 | Dennison et al. | |
| 6,613,604 B2 | 9/2003 | Maimon et al. | |
| 6,621,095 B2 | 9/2003 | Chiang et al. | |
| 6,625,054 B2 | 9/2003 | Lowery et al. | |
| 6,642,102 B2 | 11/2003 | Xu | |
| 6,646,297 B2 | 11/2003 | Dennison | |
| 6,649,928 B2 | 11/2003 | Dennison | |
| 6,667,900 B2 | 12/2003 | Lowery et al. | |
| 6,670,628 B2 | 12/2003 | Lee et al. | |
| 6,671,710 B2 | 12/2003 | Ovshinsky et al. | |
| 6,673,648 B2 | 1/2004 | Lowrey | |
| 6,673,700 B2 | 1/2004 | Dennison et al. | |
| 6,674,115 B2 | 1/2004 | Hudgens et al. | |
| 6,687,153 B2 | 2/2004 | Lowery | |
| 6,687,427 B2 | 2/2004 | Ramalingam et al. | |
| 6,690,026 B2 | 2/2004 | Peterson | |
| 6,696,355 B2 | 2/2004 | Dennison | |
| 6,707,712 B2 | 3/2004 | Lowery | |
| 6,714,954 B2 | 3/2004 | Ovshinsky et al. | |
| 6,859,389 B2 | 2/2005 | Idehara | |
| 6,936,840 B2 * | 8/2005 | Sun et al. | 257/30 |
| 7,071,095 B2 | 7/2006 | Huang et al. | |
| 7,098,068 B2 | 8/2006 | Brooks | |
| 7,151,273 B2 | 12/2006 | Campbell et al. | |
| 2002/0000666 A1 | 1/2002 | Kozicki et al. | |
| 2002/0072188 A1 | 6/2002 | Gilton | |
| 2002/0106849 A1 | 8/2002 | Moore | |

| | | | |
|---|---|---|---|
| 2002/0123169 A1 | 9/2002 | Moore et al. | |
| 2002/0123170 A1 | 9/2002 | Moore et al. | |
| 2002/0123248 A1 | 9/2002 | Moore et al. | |
| 2002/0127886 A1 | 9/2002 | Moore et al. | |
| 2002/0132417 A1 | 9/2002 | Li | |
| 2002/0160551 A1 | 10/2002 | Harshfield | |
| 2002/0163828 A1 | 11/2002 | Krieger et al. | |
| 2002/0168820 A1 | 11/2002 | Kozicki | |
| 2002/0168852 A1 | 11/2002 | Harshfield et al. | |
| 2002/0190289 A1 | 12/2002 | Harshfield et al. | |
| 2002/0190350 A1 | 12/2002 | Kozicki et al. | |
| 2003/0001229 A1 | 1/2003 | Moore et al. | |
| 2003/0027416 A1 | 2/2003 | Moore | |
| 2003/0032254 A1 | 2/2003 | Gilton | |
| 2003/0035314 A1 | 2/2003 | Kozicki | |
| 2003/0035315 A1 | 2/2003 | Kozicki | |
| 2003/0038301 A1 | 2/2003 | Moore | |
| 2003/0043631 A1 | 3/2003 | Gilton et al. | |
| 2003/0045049 A1 | 3/2003 | Campbell et al. | |
| 2003/0045054 A1 | 3/2003 | Campbell et al. | |
| 2003/0047765 A1 | 3/2003 | Campbell | |
| 2003/0047772 A1 | 3/2003 | Li | |
| 2003/0047773 A1 | 3/2003 | Li | |
| 2003/0048519 A1 | 3/2003 | Kozicki | |
| 2003/0048744 A1 | 3/2003 | Ovshinsky et al. | |
| 2003/0049912 A1 | 3/2003 | Campbell et al. | |
| 2003/0068861 A1 | 4/2003 | Li et al. | |
| 2003/0068862 A1 | 4/2003 | Li et al. | |
| 2003/0095426 A1 | 5/2003 | Hush et al. | |
| 2003/0096497 A1 | 5/2003 | Moore et al. | |
| 2003/0107105 A1 | 6/2003 | Kozicki | |
| 2003/0117831 A1 | 6/2003 | Hush | |
| 2003/0128612 A1 | 7/2003 | Moore et al. | |
| 2003/0137869 A1 | 7/2003 | Kozicki | |
| 2003/0143782 A1 | 7/2003 | Gilton et al. | |
| 2003/0155589 A1 | 8/2003 | Campbell et al. | |
| 2003/0155606 A1 | 8/2003 | Campbell et al. | |
| 2003/0156447 A1 | 8/2003 | Kozicki | |
| 2003/0156463 A1 | 8/2003 | Casper et al. | |
| 2003/0209728 A1 | 11/2003 | Kozicki et al. | |
| 2003/0209971 A1 | 11/2003 | Kozicki et al. | |
| 2003/0210564 A1 | 11/2003 | Kozicki et al. | |
| 2003/0212724 A1 | 11/2003 | Ovshinsky et al. | |
| 2003/0212725 A1 | 11/2003 | Ovshinsky et al. | |
| 2004/0035401 A1 | 2/2004 | Ramachandran et al. | |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

Afifi,M.A.; Labib, H.H.; Fouad, S.S.; El-Shazly, A.A., Electrical & Thermal Conductivity of the Amorphous Semiconductor GexSe1-x, Egypt, J. Phys. 17 (1986) 335-342.

Alekperova, Sh.M.; Gadzhieva, G.S., Current-voltage Characteristics of Ag2Se Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Supertonic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenidfe Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Supertonic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound Ag7GeSe5l: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures M-Ag2Se-M, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in Ag2Se Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in Ag2Se/Se/M Thin Film Sandwiches, Thin Solid Films 97 (1982) 165-171.

Bernede, J.C.; Khelil, A.; Kettaf, M.; Conan, A., Transition from S- to N-type Differential Negative Resistance in Al-Al2O3-Ag2-xSe1+x Thin Film Structures, Phys. Stat. Sol. (a) 74 (1982) 217-224.

Bondarev, V.N.; Pikhitsa, P.V., A Dendrite Model of Current Instability in RbAg4l5, Solid State Ionics 70/71 (1994) 72-76.

Boolchand, P., The Maximum in Glass Transition Temperature (Tg) Near x=⅓ in GexSe1-x Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1-x Glasses, Solid State Comm. 45 (1983) 183-185.

Boolchand, P.; Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) 17th (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1-x Films, Appl. Phys. Lett. 37 (1980) 1075-1077.

Chen, G.; Cheng, J., Role of Nitrogen in the Crystallization of Silicon Nitride-doped Chalcogenide Glasses, J. Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-GeSe, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1-x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., the Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

Ei-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. NonCryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizone State University, pp. Title p. 114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Hirose, Y.; Hirose, H., Polarity-dependent memory switching and behavior of Ag dendrite in Ag-photodoped amorphous As2S3 films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Huggett et al., Development of silver sensitized germanium selenide photoresist by reactive sputter etching in SF6, 42 Appl. Phys. Lett., No. 7, pp. 592-594 (Apr. 1983).

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi et al., *Mechanism of photosurface deposition*, 164-166 J. Non-Cryst. Solids, pp. 1231-1234 (1993).

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both systems, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawamoto, Y., Nishida, M., Ionic Condition in As2S3—Ag2S, GeS2—GeS—Ag2S and P2S5—Ag2S Glasses, J. Non-Cryst Solids 20(1976) 393-404.

Kawasaki, M.; Kawamura, J.; Nakamura, Y.; Aniya, M., Ionic conductivity of Agx(GeSe3)1-x ($0<=x<=0.571$) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Kolobov et al., Photodoping of amorphous chalcogenides by metals, Advances in Physics, 1991, vol. 40, No. 5, pp. 625-684.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N. A.; Abdel-Aziz, M.M., Memory switching in amorphous GeSeTl chalcogenide semiconductor films, Thin Solid Films 240 (1994) 143-146.

Kozicki et al., Silver incorporation in thin films of selenium rich Ge-Se glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes In Metal-Doped Chalcogenides, Electrochemical Society Proceedings, vol. 99-13, 1999, pp. 298-309.

Kozicki et al., Nanoscale effects in devices based on chalcogenide solid solutions, Superlattices and Microstructures, vol. 27, No. 516, 2000, pp. 485-488.

Kozicki et al., Nanoscale phase separation in Ag-Ge-Se glasses, Microelectronic Engineering 63 (2002) pp. 155-159.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

McHardy et al., The dissolution of metals in amorphous chalcogenides and the effects o electron and ultraviolet radiation, 20 J. Phys. C.: Solid State Phys., pp. 4055-4075 (1987)f.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell, A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.; Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3365 (1973).

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/ metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal(??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag-Ge-Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

N. Tugluoglu et al.—"Temperature-dependent barrier characteristics of Ag/P-SnSe Schottky diodes based on *I-V-T* measurements," Semiconductor Science and Technology, 19 (2004), pp. 1092-1097.

P. Pattanayak et al.—"Signature of a silver phase percolation threshold in microscopically phase separated ternary $Ge_{0.15}Se_{0.85-x}Ag_x$ ($0 \leq x \leq 0.20$) glasses," Journal of Applied Physics 97, (2005), pp. 013515-1 thru 013515-4.

* cited by examiner

US 7,910,397 B2

SMALL ELECTRODE FOR RESISTANCE VARIABLE DEVICES

This application is a divisional of application Ser. No. 11/018,366, filed Dec. 22, 2004, now U.S. Pat. No. 7,374,174 which is hereby incorporated by reference in its entirety.

FIELD OF THE INVENTION

The invention relates to the field of random access memory (RAM) devices formed using a resistance variable material, and in particular to an improved structure for and a method of manufacturing a resistance variable memory element.

BACKGROUND OF THE INVENTION

Resistance variable memory elements, which include Programmable Conductive Random Access Memory (PCRAM) elements, have been investigated for suitability as semi-volatile and non-volatile random access memory devices. An exemplary PCRAM device is disclosed in U.S. Pat. No. 6,348,365 to Moore and Gilton.

In a PCRAM device, a conductive material, e.g., silver or other conductive ion, is incorporated into a chalcogenide glass. The resistance of the chalcogenide glass can be programmed to stable higher resistance and lower resistance states based on a voltage controlled movement of the conductive material within or into and out of the chalcogenide glass. An unprogrammed PCRAM device is normally in a higher resistance state. A write operation programs the PCRAM device to a lower resistance state by applying a voltage potential across the chalcogenide glass and forming a conduction channel. The PCRAM device may then be read by applying a voltage pulse of a lesser magnitude than required to program it; the resistance across the memory device is then sensed as higher or lower to define binary logic states.

The programmed lower resistance state of a PCRAM device can remain intact for an indefinite period, typically ranging from hours to weeks, after the voltage potentials are removed; however, some refreshing may be useful. The PCRAM device can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such a device can function as a variable resistance memory having at least two resistance states, which can define two respective logic states, i.e., at least a bit of data.

A typical resistance variable cell 100 is shown in FIG. 1. The chalcogenide glass layer 7 is formed between top and bottom electrodes 2, 4 respectively. There may also be a metal containing layer 5, e.g., a silver layer, between the chalcogenide glass layer 7 and the top electrode 2. The metal layer 5 provides metal ions for the switching operations, and the electrode 2 may also provide metal ions for switching. In the conventional cell 100, the bottom electrode 4 may be formed as a plug within a dielectric layer 3. Typically, the electrode 4 is formed by chemical vapor deposition (CVD) processes. The conventional electrode 4 has some disadvantages. CVD processes result in seams or gaps between the electrode and adjacent structures. Additionally, the CVD processes produce electrodes with rough surfaces. Also, the plug electrode 4 has a relatively large surface area. These disadvantages can diminish the consistency and controllability of a device containing the conventional cell 100.

Therefore, it is desired to have an improved electrode for use in a resistance variable device and a method for forming the same.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

Figure 1:
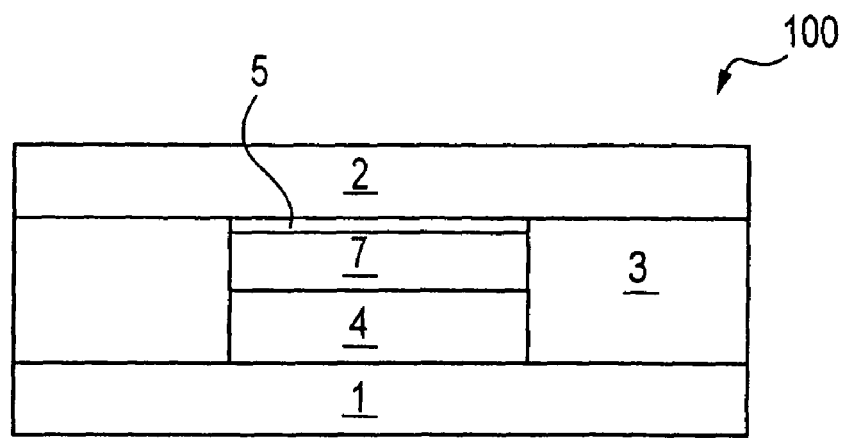
FIG. 1 is a cross-sectional view of a conventional resistance variable element.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a plastic or a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor material structures. When reference is made to a semiconductor substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species, which have a slight excess or deficit of silver, for instance, $Ag_2Se$, $Ag_{2+x}Se$, and $Ag_{2-x}Se$.

The term "tin" is intended to include not only elemental tin, but tin with other trace metals or in various alloyed combinations with other metals as known in the semiconductor industry, as long as such tin alloy is conductive, and as long as the physical and electrical properties of the tin remain unchanged.

The term "tin-chalcogenide" is intended to include various alloys, compounds, and mixtures of tin and chalcogens (e.g., sulfur (S), selenium (Se), tellurium (Te), polonium (Po), and oxygen (O)), including some species which have a slight excess or deficit of tin. For example, tin selenide, a species of tin-chalcogenide, may be represented by the general formula $Sn_{1+/-}Se$. Though not being limited by a particular stoichiometric ratio between Sn and Se, devices of the present invention typically comprise an $Sn_{1+/-}Se$ species where x ranges between about 1 and about 0.

The term "chalcogenide glass" is intended to include glasses that comprise an element from group VIA (or group 16) of the periodic table. Group VIA elements, also referred to as chalcogens; include sulfur (S), selenium (Se), tellurium (Te), polonium (Po), and oxygen (O).

The term "semi-volatile memory" is intended to include any memory device or element which is capable of maintaining its memory state after power is removed from the device for a prolonged period of time. Thus, semi-volatile memory devices are capable of retaining stored data after the power source is disconnected or removed. Accordingly, the term "semi-volatile memory" is also intended to include not only semi-volatile memory devices, but also non-volatile memory devices.

The term "resistance variable material" is intended to include materials that can support the formation of a conduction channel in response to an applied voltage. Such materials include, for example, chalcogenide glasses, chalcogenide glasses comprising a metal, such as silver; a polymer, such as polymethylphenylacetylene, copperphtalocyanine, polyparaphenylene, polyphenylenevinylene, polyaniline, polythiophene and polypyrrole; and amorphous carbon. For instance, the term "resistance variable material" includes silver doped chalcogenide glasses, silver-germanium-selenide glasses, and chalcogenide glass comprising a silver-selenide layer.

The term "resistance variable memory element" is intended to include any memory element, including programmable conductor memory elements, semi-volatile memory elements, and non-volatile memory elements, which exhibit a resistance change in response to an applied voltage.

Figure 2:
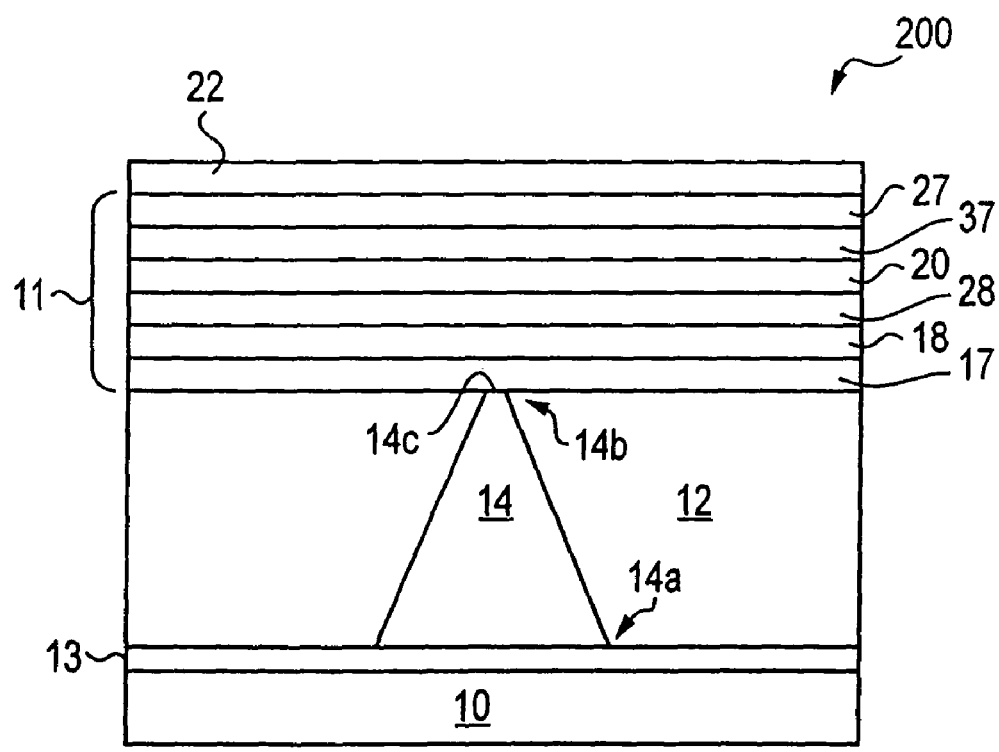
FIG. 2 is a cross-sectional diagram of a memory element according to an exemplary embodiment of the invention.

The invention will now be explained with reference to the figures, which illustrate exemplary embodiments and where like reference numbers indicate like features. FIG. 2 depicts a memory element 200 according to an exemplary embodiment of the invention. The memory element 200 is formed on a substrate 10. Over the substrate 10, though not necessarily directly so, is a conductive address line 13, which serves as an interconnect for the device 200 shown and a plurality of other similar devices of a portion of a memory array of which the shown device 200 is a part. It is possible to incorporate an optional insulating layer (not shown) between the substrate 10 and address line 13, and this may be preferred if the substrate 10 is semiconductor-based.

Over the address line 13 is a first electrode 14 formed within a first insulating layer 12. Over the first electrode 14 and first insulating layer 12 is a stack of layers 11, which includes at least one layer of resistance variable material. In the exemplary embodiment of FIG. 2, the stack of layers 11 includes a first chalcogenide glass layer 17, a metal containing layer 18, a first silver layer 28, a second chalcogenide glass layer 20, a second silver layer 37 and a conductive adhesion layer 27. A second electrode 22 is formed over the stack 11.

The invention is not limited to a stack 11, having specific layers 17, 28, 18, 20, 37, 27. Embodiments of the invention include stacks 11 having greater than or fewer than six layers and having layers comprising different materials providing that at least one layer is a resistance variable material. For example, the resistance variable material can comprise amorphous carbon and/or any one or more of the glass layers 17, 20 can be made up of a plurality of sublayers.

Preferably, the first and second chalcogenide glass layers 17, 20 are germanium-selenide glass having a $Ge_xSe_{100-x}$ stoichiometry. The preferred stoichiometric range is between about $Ge_{20}Se_{80}$ to about $Ge_{43}Se_{57}$, and is more preferably about $Ge_{40}Se_{60}$. The metal containing layer 18 may be any suitable metal containing layer, for instance, silver-chalcogenide layers, such as silver-sulfide, silver-oxide, silver-telluride, and silver-selenide; or tin-chalcogenide layers, such as tin selenide; among others. The conductive adhesion layer 27 can be a glass layer. In the illustrated exemplary embodiment, the conductive adhesion layer 27 is a third chalcogenide glass layer formed of a same material as the first and/or second chalcogenide glass layers 17, 20.

As shown in FIG. 2, the first electrode 14 is formed such that a minimized surface area of the first electrode 14 is in contact with the stack of layers 11. This minimized contact area is indicated in FIG. 2 as 14c. In the case of the embodiment of FIG. 2, the first electrode is formed having a tapered shape such that a first end 14a 14 is larger than a second end 14b of the electrode 14. Specifically, in the embodiment illustrated in FIG. 2, the first electrode 14 has a cone-like structure, such that the second end 14b of the "cone" in contact with the first chalcogenide glass layer 17. The minimized contact area 14c is in contact with the stack of layers 11 promotes consistency and controllability of the memory element 200. During operation, the minimized contact area 14c of the first electrode 14 also serves to enhance the electric field to facilitate the formation of a conduction channel by ionic movement to improve the switching of the memory element 200. Also, since the contact area 14c is smaller than that in a conventional memory element 100 (FIG. 1), there can be better control over the particular location where the conduction channel will be formed. Accordingly, the first electrode 14 serves to improve the uniformity of the switching properties of the memory element 200.

FIGS. 3A-3F depict the formation of the memory element 200 according to an exemplary embodiment of the invention. No particular order is required for any of the actions described herein, except for those logically requiring the results of prior actions. Accordingly, while the actions below are described as being performed in a general order, the order is exemplary only and can be altered if desired.

Figure 3A:
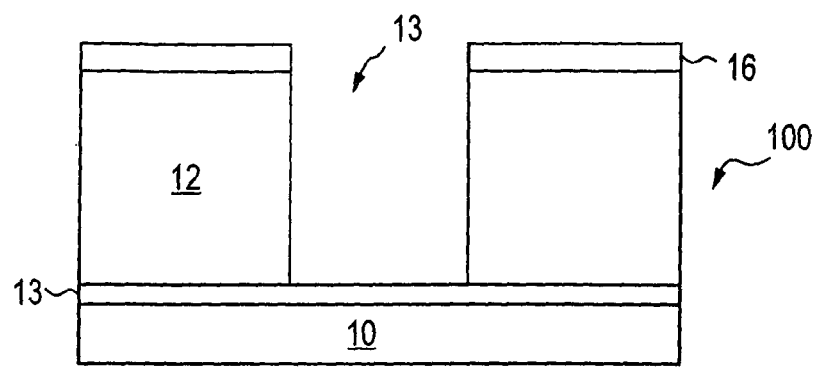
FIGS. 3A-3F depict the fabrication of the memory element of FIG. 2 at various stages of processing according to an exemplary embodiment of the invention.

FIG. 3A illustrates a conductive address line 13, formed over the substrate 10. Optionally, an insulating layer (not shown) can be formed between the substrate 10 and address line 13, and this may be preferred if the substrate 10 is semiconductor-based. The conductive address line 13 can be formed by any suitable techniques and can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials.

A first insulating layer 12 is formed over the conductive address line 13. The insulating layer 12 may be formed by any known deposition methods, such as sputtering by chemical vapor deposition (CVD), plasma enhanced CVD (PECVD) or physical vapor deposition (PVD). The insulating layer 12 may be formed of a conventional insulating oxide, such as silicon oxide ($SiO_2$), a silicon nitride ($Si_3N_4$); a low dielectric constant material; among many others.

A mask 16 is formed over the insulating layer 12. In the illustrated embodiment, the mask 16 is a photoresist mask;

the mask 16, however, could instead be any other suitable material such as, for example, a metal. An opening 13 extending to the substrate 10 is formed in the first insulating layer 12 and mask 16. The opening 13 may be formed by known methods in the art, for example, by a conventional patterning and etching process. Preferably, the opening 13 is formed by a dry etch via process to have substantially vertical sidewalls.

Figure 3B:
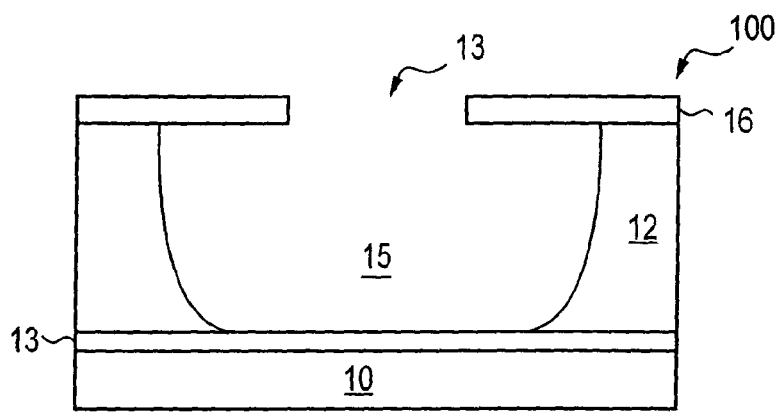

As shown in FIG. 3B, a portion of the opening 13 is widened to form an opening 15 within the insulating layer 12. The opening 15 extends under the mask 16, such that the opening 13 through the mask 16 is smaller than the opening 15 through the insulating layer 12. Preferably, the opening 15 is formed using a wet etch process.

Figure 3C:
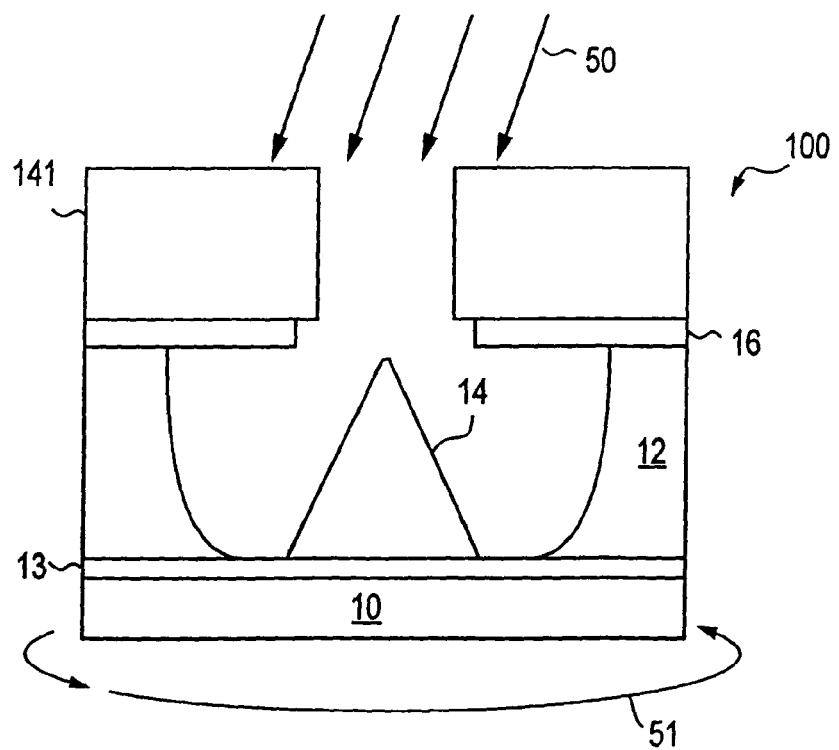

FIG. 3C depicts the formation of the first electrode 14. A conductive material is deposited on the mask 16 and through the openings 13, 15 onto the substrate 10 to form a cone-like shaped first electrode 14 and a conductive layer 14l over the mask 16. The first electrode 14 may comprise any conductive material, for example, tungsten, nickel, tantalum, aluminum, platinum, conductive nitrides, and other materials. Preferably, the conductive material is deposited by a physical vapor deposition (PVD) process, such as evaporation or collimated sputtering, but any suitable technique may be used. As indicated by arrow 51, the substrate 10 is rotated during deposition of the conductive material. Additionally, as indicated by arrows 50, the conductive material is deposited in a single direction. Preferably, as shown in FIG. 3C by the angle of the arrows 50, the conductive material is deposited at an angle less than approximately 90 degrees with respect to the top surface of the substrate 10, but the conductive material can also deposited at an angle of approximately 90 degrees.

By forming the electrode 14 using a PVD process, the seams or gaps that occur when an electrode is formed in the conventional chemical vapor deposition (CVD) plug process can be avoided. Additionally, PVD deposited material tends to have a smoother surface than CVD deposited material. Accordingly the electrode 14 may have a smoother surface than the conventional electrode 4 (FIG. 1). Additionally, the conventional CVD processes limit the materials that can be used as the electrode 4, whereas PVD processes are available for a wider range of suitable materials.

Figure 3D:
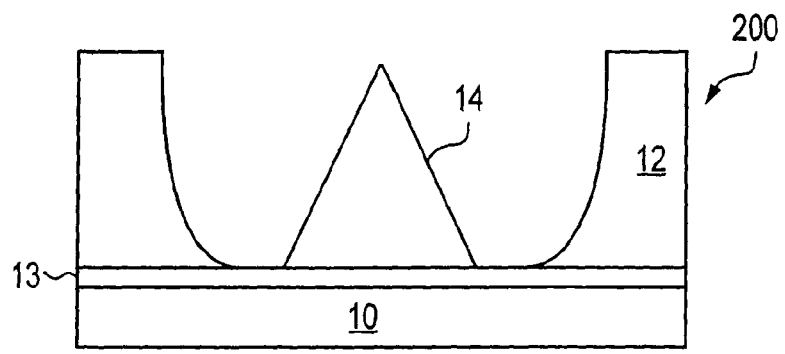

The conductive layer 14l and the mask 16 are removed, as illustrated in FIG. 3D. This can be accomplished by any suitable technique. For example, a chemical mechanical polish (CMP) step can be conducted or a solvent lift-off process may be used according to known techniques.

Figure 3E:
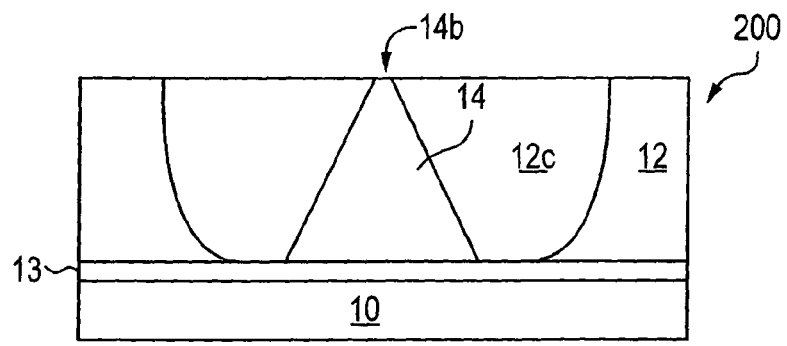

Referring to FIG. 3E, a conformal insulating layer 12c is formed within the opening 15 and surrounding the first electrode 14. The insulating layer 12c may be, but is not necessarily, the same material as the insulating layer 12. Accordingly, for simplicity, the insulating layers 12 and 12c are collectively represented by the reference numeral 12.

A CMP step is conducted to planarize the insulating layer 12 and expose the small end 14b of the first electrode 14 to achieve the structure shown in FIG. 3E.

Figure 3F:
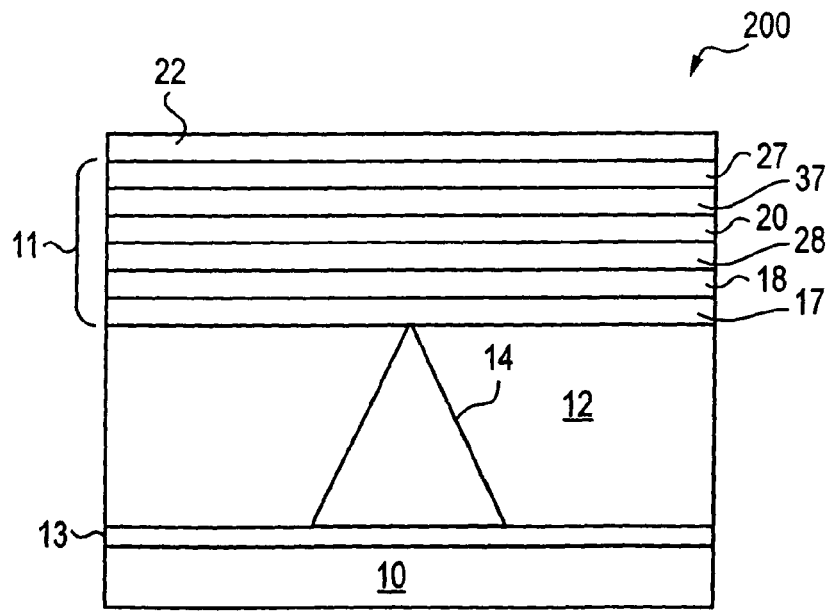

Referring to FIG. 3F, the stack 11 of layers for producing resistance variable memory elements is formed over the insulating layer 12 and the first electrode 14. The element 200 is defined by the location of the electrode 14. Additional electrodes 14 (not shown) can be formed to define additional memory elements. As an example, a first chalcogenide glass layer 17 is formed over the insulating layer 12 and the first electrode 14. According to an embodiment of the invention, the first chalcogenide glass layer 17 can be germanium-selenide glass having a $Ge_xSe_{100-x}$ stoichiometry. The preferred stoichiometric range is between about $Ge_{20}Se_{80}$ to about $Ge_{43}Se_{57}$, and is more preferably about $Ge_{40}Se_{60}$. The first chalcogenide glass layer 17 preferably has a thickness from about 100 Angstroms (Å) to about 1000 Å, and is more preferably about 150 Å.

The formation of the first chalcogenide glass layer 17, having a stoichiometric composition in accordance with the invention, may be accomplished by any suitable method. For instance, germanium-selenide glass can be formed by evaporation, co-sputtering germanium and selenium in the appropriate ratios, sputtering using a germanium-selenide target having the desired stoichiometry, or chemical vapor deposition with stoichiometric amounts of $GeH_4$ and $SeH_2$ gases (or various compositions of these gases), which result in a germanium-selenide film of the desired stoichiometry, are examples of methods which may be used.

A metal containing layer 18 is formed over the first chalcogenide glass layer 17. The metal containing layer 18 may be any suitable metal containing layer. For instance, suitable metal containing layers include silver-chalcogenide layers, such as silver-sulfide, silver-oxide, silver-telluride, and silver-selenide. Alternatively, the metal containing layer 18 is a layer of tin-chalcogenide, preferably tin selenide ($Sn_{1+/-x}Se$, where x is between about 1 and 0). It is also possible that other chalcogenide materials may be substituted for selenium here, such as sulfur, oxygen, or tellurium.

A variety of processes can be used to form the metal containing layer 18. For instance, physical vapor deposition techniques such as evaporative deposition, sputtering may be used, chemical vapor deposition, or co-evaporation may be used. Also, where the metal containing layer 18 is silver-selenide, depositing a layer of selenium above a layer of silver to form a silver-selenide layer can also be used.

The metal containing layer 18 is preferably about 500 Å thick; however, its thickness depends, in part, on the thickness of the underlying chalcogenide glass layer 17. Preferably, the thickness of layers 17 and 18 is such that a ratio of the metal containing layer 18 thickness to the first chalcogenide glass layer 17 thicknesses is between about 5:1 and about 1:1. In other words, the metal containing layer 18 thickness is between about 1 to about 5 times greater than the first chalcogenide glass layer 17 thickness. Even more preferably, the ratio is about 2.5:1.

Still referring to FIG. 3F, a metal layer 28 is provided over the metal containing layer 18, with silver (Ag) being preferred as the metal. This metal layer 28 should be about 500 Å thick. This silver (or other metal) layer 28 assists the switching operation of the memory device.

A second chalcogenide glass layer 20 is formed over the first metal layer 28. The second chalcogenide glass layer 20 may, but need not, have the same stoichiometric composition as the first chalcogenide glass layer, e.g., $Ge_xSe_{100-x}$. Thus, the second glass layer 20 may be of a different material, different stoichiometry, and/or more rigid than the first chalcogenide glass layer 17.

The thickness of layers 18 and 20 are such that the metal containing layer 18 thickness is greater than the second chalcogenide glass layer 20 thickness. Preferably, a ratio of the metal containing layer 18 thickness to the second chalcogenide glass layer 20 thickness is between about 5:1 and about 1:1. More preferably, the ratio is between about 3.3:1 and about 2:1. The second chalcogenide glass layer 20 thickness is preferably between about 100 Å to about 1000 Å, and is more preferably about 150 Å. The second chalcogenide glass layer 20 may be formed by any suitable method. For example, chemical vapor deposition, evaporation, co-sputtering, or sputtering using a target having the desired stoichiometry, may be used.

A second silver layer 37 is deposited over the second chalcogenide glass layer 20 by any suitable means, such as sputtering or plating techniques, including electroplating or electroless plating. The desired thickness of the second silver layer 37 is about 200 Å. A conductive adhesion layer 27 is formed over the second silver layer 37. Suitable materials for the conductive adhesion layer 27 include materials capable of providing good adhesion between the second silver layer 37 and the top electrode layer 22. Desirable materials for the conductive adhesion layer 27 include chalcogenide glasses. Therefore, the conductive adhesion layer 27 can be a third chalcogenide glass layer and can be a same material as the first and/or second chalcogenide glass layers 17, 20.

A second electrode 22 is formed over the conductive adhesion layer 27. The second electrode 22 may comprise any electrically conductive material, for example, tungsten, tantalum, titanium, conductive nitrides, or other materials.

Conventional processing steps can be carried out to electrically couple the memory element 200 to various circuits of a memory array.

After formation of the memory element 200, a conditioning step is conducted to form a conduction channel within the first chalcogenide glass layer 17. Specifically, in the illustrated embodiment of FIG. 2, the conditioning step comprises applying a potential across the memory element structure 200 such that metal ions from the metal containing layer 18 are driven into the first chalcogenide glass layers 17, forming a conduction channel. After conditioning, movement of metal ions into or out of the conduction channel by application of voltages across the memory element structure 200 causes an overall resistance change for the memory element 200. The pulse width and amplitude of the conditioning potential generally has a longer pulse width and higher amplitude than a typical potential used to program the memory element. After the conditioning step, the memory element 200 may be programmed.

FIGS. 4A-4D illustrate another exemplary embodiment for forming the memory element 200 according to the invention. The embodiment illustrated in FIGS. 4A-4D is similar to that described in FIGS. 3A-3F, except that a second opening 15 need not be formed, and a nitride layer 19 is formed between the insulating layer 12 and the mask 16.

Figure 4A:
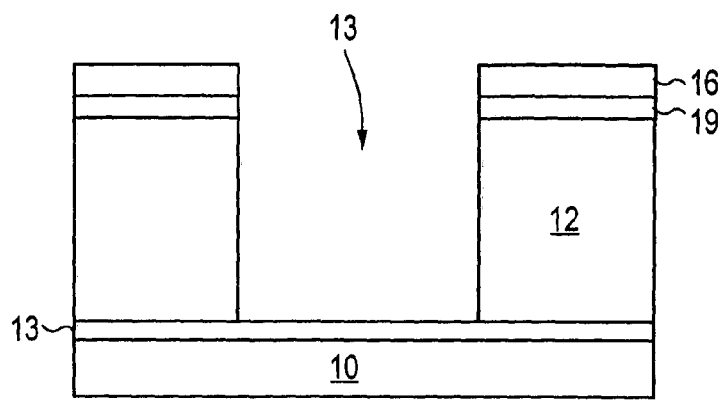
FIGS. 4A-4D depict the fabrication of the memory element of FIG. 2 at various stages of processing according to another exemplary embodiment of the invention.

As shown in FIG. 4A, a nitride layer 19 is formed between the mask 16 and the insulating layer 12. In the illustrated embodiment, the mask 16 is a photoresist mask, but the mask could instead be any other suitable material such as, for example, a metal. An opening 13 extending to the substrate 10 is formed in the first insulating layer 12, the nitride layer 19, and mask 16. A second opening 15 within the insulating layer 12 and nitride layer 19 may also be formed, but is not required and is omitted in the embodiment of FIGS. 4A-4D.

Figure 4B:
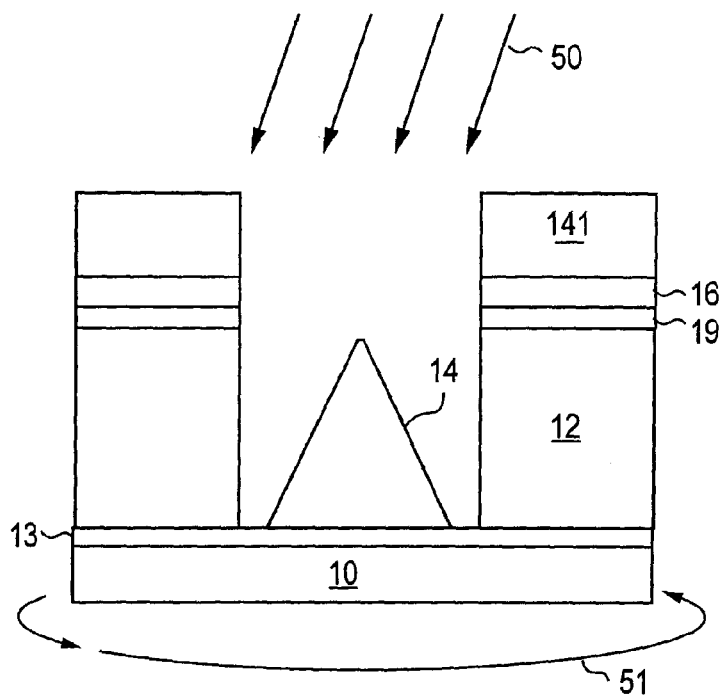

The electrode 14 can be formed as described above in connection with FIG. 3C. Accordingly, a conductive material is deposited over the mask 16 and through the opening 13 onto the substrate 10 to form a cone-like first electrode 14 and a conductive layer 14l over the mask 16. As indicated by arrow 51, the substrate 10 is rotated during deposition of the conductive material. Additionally, as indicated by arrows 50, the conductive material is deposited in a single direction. Preferably, as shown in FIG. 4B by the angle of arrows 50, the conductive material is deposited at an angle less than approximately 90 degrees with respect to the top surface of the substrate 10, but the conductive material can also deposited at an angle less of approximately 90 degrees.

Figure 4C:
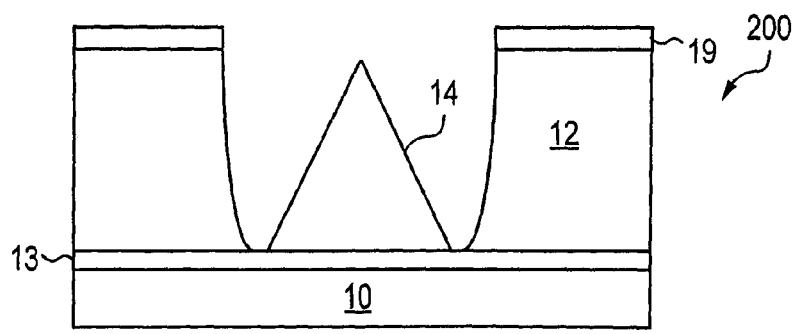
Figure 4D:
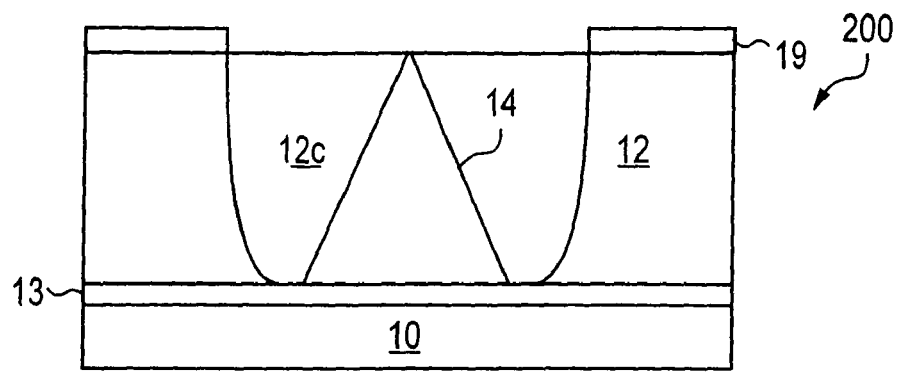

The conductive layer 14l and the mask 16 are removed, as illustrated in FIG. 4C. For this, a CMP step is conducted and stopped on the nitride layer 19. A conformal insulating layer 12c is formed within the opening 13 and surrounding the first electrode 14 to achieve the structure shown in FIG. 4D. The insulating layer 12c may be, but is not necessarily, the same material as the insulating layer 12. A stack 11 and second electrode 22 can be formed as described above in connection with FIG. 3F.

Figure 5A:
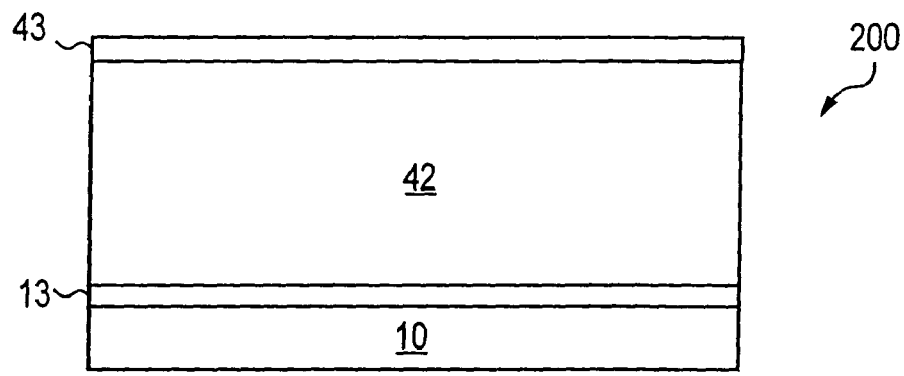
FIGS. 5A-5E depict the fabrication of the memory element of FIG. 5 at various stages of processing according to another exemplary embodiment of the invention.
Figure 5B:
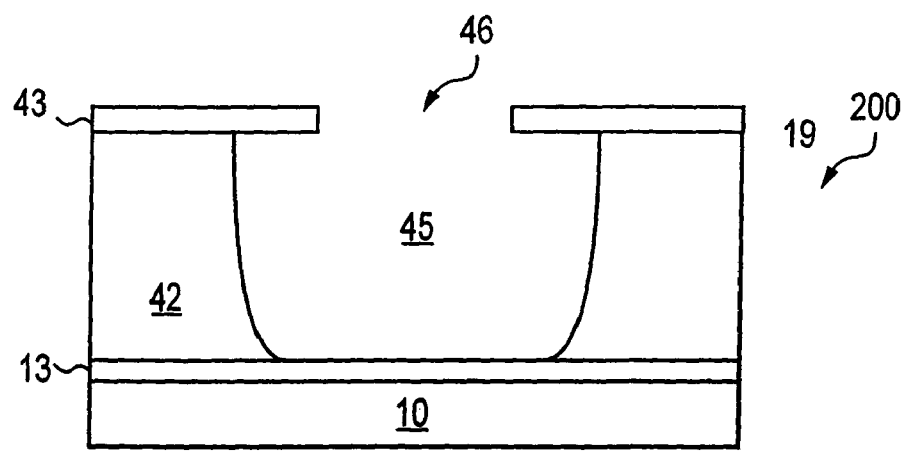
Figure 5C:
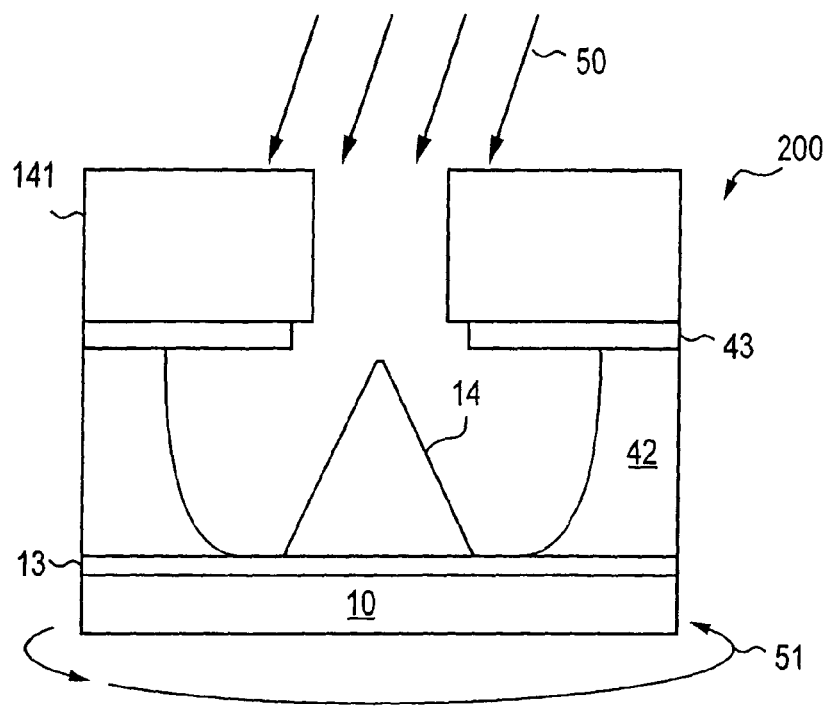

According to another exemplary embodiment, instead of forming the electrode 14 through openings 13, 15 within a mask 16 and insulating layer 12, respectively, the electrode 14 can be formed through openings in layers of photoresist, as shown in FIGS. 5A-5C and described in more detail below. Referring to FIG. 5A, first and second photoresist layers 42, 43, respectively, are formed on the substrate 10. As shown in FIG. 5B, the layers 42, 43 are patterned and developed to form an opening 46 through the second photoresist layer 43 and an opening 45 through the first photoresist layer 42. The first photoresist layer 42 is chosen such that opening 45 will be larger than opening 42. Accordingly, the first photoresist layer 42 has a higher sensitivity to the development processes than the second photoresist layer 43.

As shown in FIG. 5C, the first electrode 14 is formed through the openings 45, 46 and on the substrate 10. The first electrode 14 can be formed in a similar manner to that described above in FIG. 3C. Accordingly, a conductive material is deposited on the second photoresist layer 43 and onto the substrate 10 to form a cone-like shaped first electrode 14 and a conductive layer 14l on the second photoresist layer 43. The first electrode 14 may comprise any conductive material, for example, tungsten, nickel, tantalum, aluminum, platinum, conductive nitrides, and other materials. Preferably, the conductive material is deposited by evaporation or collimated sputtering, but any suitable technique may be used. As indicated by arrow 51, the substrate 10 is rotated during deposition of the conductive material. Additionally, as indicated by arrows 50, the conductive material is deposited in a single direction. Preferably, as shown in FIG. 5C by the angle of arrows 50, the conductive material is deposited at an angle less than approximately 90 degrees with respect to the top surface of the substrate 10, but the conductive material can also deposited at an angle less of approximately 90 degrees.

Figure 5D:
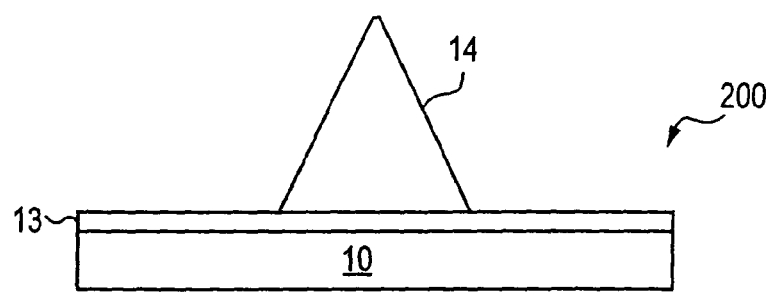

The conductive layer 14l and first and second photoresist layers 42, 43 are removed, as illustrated in FIG. 5D. This can be accomplished by any suitable technique. For example, a solvent lift-off process may be used according to known techniques.

Figure 5E:
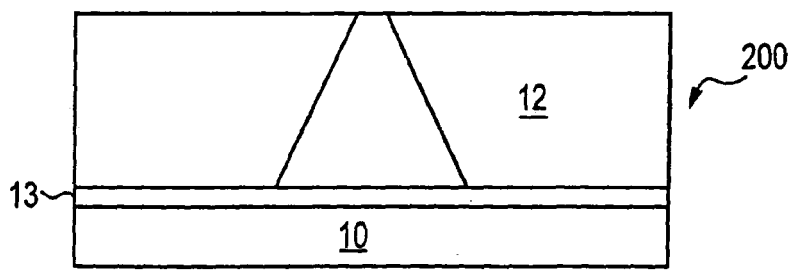

An insulating layer 12 can be formed by any suitable techniques over the substrate 10 and first electrode 14. Preferably, the insulating layer 12 is a conformal insulating layer. A CMP step is conducted to planarize the insulating layer 12 and expose the top point of the first electrode 14 to achieve the structure shown in FIG. 5E. Additional processing may be conducted as described above in connection with FIG. 3F to achieve the structure shown in FIG. 2.

Figure 6:
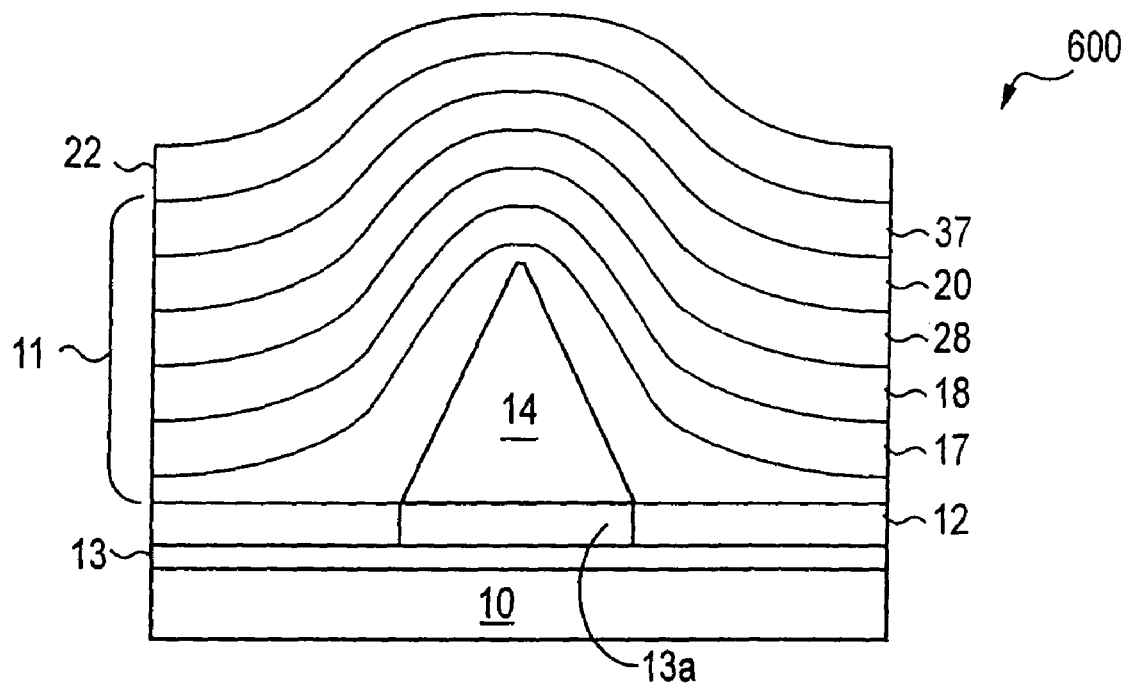
FIG. 6 is a block diagram of a memory element according to another exemplary embodiment of the invention.

Alternatively, the stack 11 can be deposited directly on the first electrode 14, omitting the insulating layer 12 surrounding the electrode 14, to form the exemplary memory element 600 shown in FIG. 6. In such a case, a conductive plug 13a can be formed within the insulating layer 12 to electrically couple the electrode 14 to the conductive address line 13. The formation of the stack 11, and second electrode 22 can be conducted as described above in connection with FIG. 3F.

The embodiments described above refer to the formation of only a few possible resistance variable memory element structures (e.g., PCRAM) in accordance with the invention, which may be part of a memory array. It must be understood, however, that the invention contemplates the formation of other memory structures within the spirit of the invention, which can be fabricated as a memory array and operated with memory element access circuits.

Figure 7:
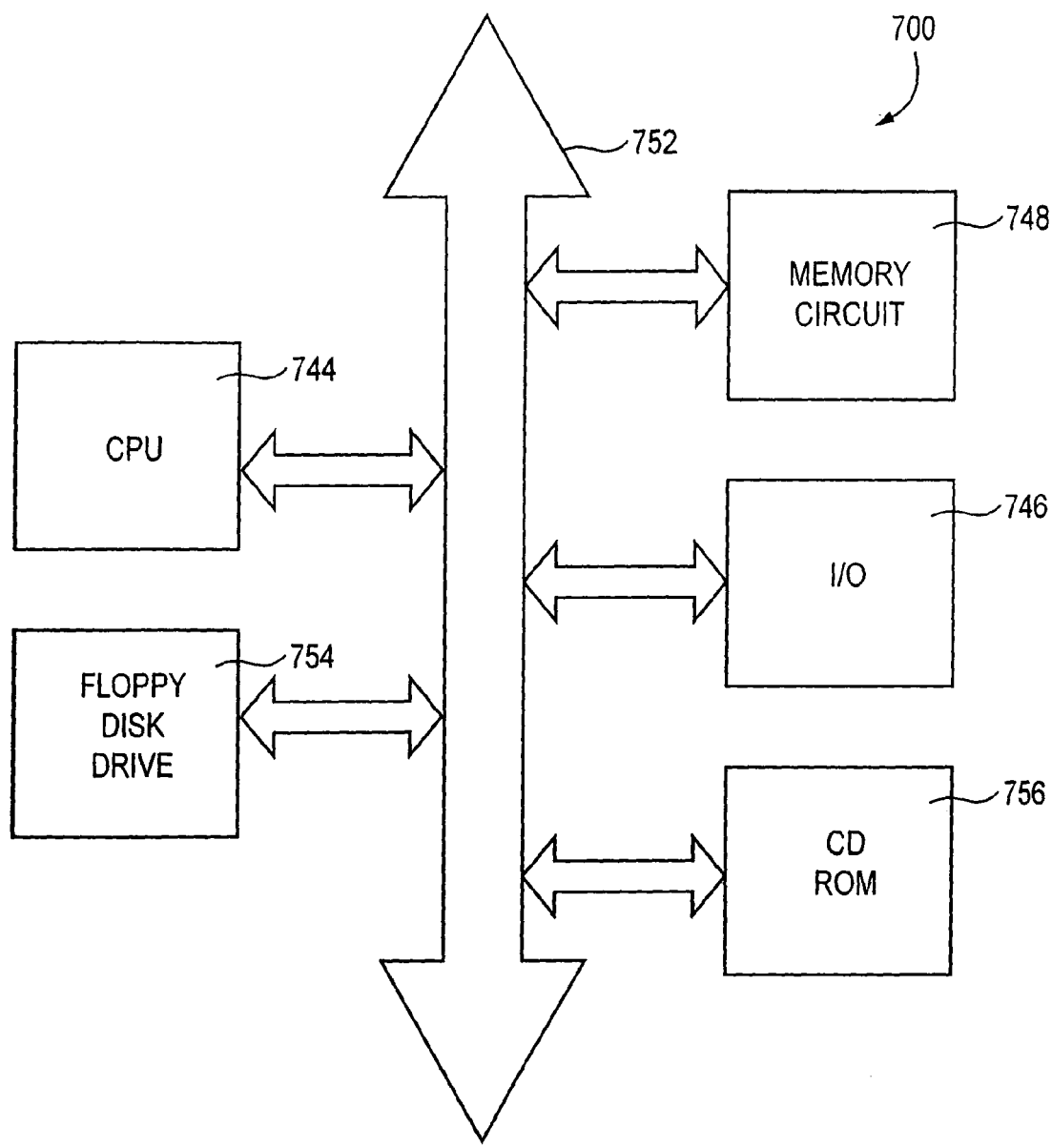
FIG. 7 illustrates a processor-based system having a memory element formed according to the invention.

FIG. 7 illustrates a processor system 700 which includes a memory circuit 748, e.g., a memory device, which employs resistance variable memory elements (e.g., elements 200 and/or 600 (FIGS. 2 and 6, respectively)) according to the invention. The processor system 700, which can be, for example, a computer system, generally comprises a central processing unit (CPU) 744, such as a microprocessor, a digital signal processor, or other programmable digital logic devices, which communicates with an input/output (I/O) device 746 over a bus 752. The memory circuit 748 communicates with the CPU 744 over bus 752 typically through a memory controller.

In the case of a computer system, the processor system 700 may include peripheral devices such as a floppy disk drive 754 and a compact disc (CD) ROM drive 756, which also communicate with CPU 744 over the bus 752. Memory circuit 748 is preferably constructed as an integrated circuit, which includes one or more resistance variable memory elements, e.g., elements 200 and/or 600. If desired, the memory circuit 748 may be combined with the processor, for example CPU 744, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of forming a memory element, the method comprising:
    forming a first electrode such that a first end of the first electrode is larger than a second end of the first electrode, wherein forming the first electrode comprises depositing a conductive material and rotating the substrate while depositing the conductive material;
    forming a second electrode; and
    forming a resistance variable material layer between the first and second electrodes, the second end of the first electrode being formed in contact with the resistance variable material.

2. The method of claim 1, wherein the conductive material is deposited in a single direction, such that the conductive material forms a cone-like structure on the substrate.

3. The method of claim 2, wherein the conductive material is deposited at an angle less than 90 degrees with respect to the top surface of the substrate.

4. A method of forming a memory element, the method comprising:
    forming a first material layer over a substrate;
    forming a second material layer over the substrate;
    forming a first opening within the first and second material layers;
    forming a first electrode such that a first end of the first electrode is larger than a second end of the first electrode, wherein forming the first electrode comprises depositing a conductive material through the first opening, and rotating the substrate while depositing the conductive material, the conductive material being deposited in a single direction, such that the conductive material forms a cone-like structure on the substrate;
    forming a second electrode; and
    forming a resistance variable material layer between the first and second electrodes, the second end of the first electrode being formed in contact with the resistance variable material.

5. The method of claim 4, wherein the conductive material is deposited at an angle less than 90 degrees with respect to the top surface of the substrate.

6. The method of claim 4, further comprising:
    forming a second opening within the second material layer, the second opening being formed by widening a portion of the first opening within the first material layer.

7. The method of claim 4, further comprising removing the second material layer.

8. The method of claim 7, wherein removing the second material layer comprises conducting a lift-off process.

9. The method of claim 7, wherein removing the second material layer comprises conducting a CMP process.

10. The method of claim 7, wherein the first material layer is a first insulating layer, and further comprising forming a second insulating layer within the second opening.

11. The method of claim 10, wherein forming the second insulating layer comprises forming a conformal insulating layer.

12. The method of claim 4, further comprising removing the first and second material layers.

13. The method of claim 12, further comprising forming a conformal insulating layer over the cone-like structure.

14. The method of claim 4, further comprising forming a nitride layer between the first and second material layers, wherein the first material layer is a first insulating layer.

15. The method of claim 14, further comprising forming a second insulating layer within the first opening.

16. The method of claim 15, wherein forming the second insulating layer comprises forming a conformal insulating layer.

17. A method of forming a memory element, the method comprising:
    forming a first insulating layer over a substrate;
    forming a mask over the first insulating layer;
    forming a first opening within the first insulating layer and the mask;
    widening a portion of the first opening within the first insulating layer to form a second opening;
    depositing a conductive material over the mask and through the first and second openings;
    rotating the substrate while depositing the conductive material, the conductive material being deposited in a single direction, such that the conductive material forms a cone-like structure on the substrate, the cone-like structure being a first electrode;
    removing a portion of the conductive material that is over the mask;
    removing the mask;
    forming a second insulating layer in the second opening;
    forming at least one layer of resistance variable material over the first and second insulating layers and electrically coupled to the first electrode; and
    forming a second electrode over the at least one layer of resistance variable material.

18. The method of claim 17, further comprising forming a nitride layer between the mask and the first insulating layer.

19. The method of claim 18, wherein removing a portion of the conductive material over the mask and removing the mask comprises conducting a CMP process to stop on the nitride layer.

20. The method of claim 17, further comprising the step of forming a stack of layers between the first and second electrodes, wherein forming the at least one resistance variable material layer comprises forming the at least one resistance variable material layer as a layer within the stack.

21. The method of claim 20, wherein forming the stack of layers comprises forming a metal containing layer.

22. The method of claim 21, wherein forming the metal containing layer comprises forming a silver containing layer.

23. The method of claim 21, wherein forming the metal containing layer comprises forming a tin containing layer.

24. A method of forming a memory element, the method comprising:

forming a first photoresist layer over a substrate;

forming a second photoresist layer over the first photoresist layer;

forming a first opening within the first photoresist layer;

forming a second opening within the second photoresist layer, the second opening being larger than the first opening;

depositing a conductive material over the mask and through the first and second openings;

rotating the substrate while depositing the conductive material, the conductive material being deposited in a single direction, such that the conductive material forms a cone-like structure on the substrate, the cone-like structure being a first electrode;

removing a portion of the conductive material over the second photoresist layer;

removing the first and second photoresist layers;

forming at least one layer of resistance variable material over and electrically coupled to the first electrode; and forming a second electrode over the at least one layer of resistance variable material.

25. The method of claim 24, further comprising:

prior to forming the at least one layer of resistance variable material, forming an insulating layer over the first electrode; and planarizing the insulating layer to expose a portion of the first electrode.

26. The method of claim 17, further comprising the step of forming a stack of layers over the first electrode, wherein forming the at least one resistance variable material layer comprises forming the at least one resistance variable material layer as a layer within the stack.

* * * * *